(12) United States Patent
Flotgen

(10) Patent No.: US 11,270,902 B2
(45) Date of Patent: Mar. 8, 2022

(54) ELECTROSTATIC SUBSTRATE HOLDER

(71) Applicant: EV Group E. Thallner GmbH, St. Florian am Inn (AT)

(72) Inventor: Christoph Flotgen, Eggerding (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 189 days.

(21) Appl. No.: 16/482,316

(22) PCT Filed: Mar. 9, 2017

(86) PCT No.: PCT/EP2017/055608
§ 371 (c)(1),
(2) Date: Jul. 31, 2019

(87) PCT Pub. No.: WO2018/162070
PCT Pub. Date: Sep. 13, 2018

(65) Prior Publication Data
US 2019/0355606 A1 Nov. 21, 2019

(51) Int. Cl.
*H01L 21/683* (2006.01)
*H01L 21/67* (2006.01)

(52) U.S. Cl.
CPC ...... *H01L 21/6831* (2013.01); *H01L 21/6838* (2013.01); *H01L 21/67248* (2013.01)

(58) Field of Classification Search
CPC ............. H01L 21/6831; H01L 21/6838; H01L 21/67248; H01L 21/68742; H01L 21/6833; H01L 21/67; B25B 11/005; B25B 11/002; B23Q 3/15; B23Q 3/152; B23Q 3/154; B23Q 3/1543

USPC ..... 269/21; 279/2.02, 3, 2.2, 4.07, 147, 901; 335/289–294

See application file for complete search history.

(56) References Cited

U.S. PATENT DOCUMENTS

| | | | |
|---|---|---|---|
| 1,533,757 A | 4/1925 | Rahbek | |
| 5,790,365 A * | 8/1998 | Shel | H01L 21/6833 361/234 |
| 5,827,080 A * | 10/1998 | Tanaka | H01R 35/025 439/164 |
| 8,449,716 B2 | 5/2013 | Wimplinger et al. | |
| 2003/0035088 A1 | 2/2003 | Emoto | |
| 2007/0201180 A1* | 8/2007 | Nakash | H01L 21/6833 361/234 |
| 2008/0166213 A1* | 7/2008 | Hunter | G03F 7/70758 414/754 |

(Continued)

FOREIGN PATENT DOCUMENTS

| | | |
|---|---|---|
| EP | 0725427 A2 | 8/1996 |
| JP | H06232047 A | 8/1994 |

(Continued)

OTHER PUBLICATIONS

International Search Report from corresponding International Patent Application No. PCT/EP2017/055608, dated Nov. 8, 2017.

*Primary Examiner* — Joseph J Hail
*Assistant Examiner* — Michael A Gump
(74) *Attorney, Agent, or Firm* — Fusner & Jaffe

(57) ABSTRACT

An electrostatic substrate holder for accommodating and holding a substrate, a method for processing a substrate, and a processing plant. The electrostatic substrate holder includes a stator having electrodes that generate an electrostatic holding force for fixing the substrate.

21 Claims, 2 Drawing Sheets

(56) References Cited

U.S. PATENT DOCUMENTS

| | | | |
|---|---|---|---|
| 2011/0063771 A1* | 3/2011 | Nishioka | C04B 35/645 361/234 |
| 2014/0083977 A1 | 3/2014 | Ui et al. | |
| 2014/0290862 A1 | 10/2014 | Sugi | |
| 2015/0016685 A1 | 1/2015 | Matsunaga et al. | |
| 2015/0170952 A1* | 6/2015 | Subramani | H02N 13/00 361/234 |
| 2015/0294890 A1* | 10/2015 | Hansen | H01L 21/682 414/816 |
| 2016/0035610 A1* | 2/2016 | Park | H01J 37/32715 156/345.29 |
| 2017/0283977 A1* | 10/2017 | Iino | C25D 21/12 |
| 2018/0053677 A1* | 2/2018 | Boughton | H01L 21/6831 |

FOREIGN PATENT DOCUMENTS

| | | |
|---|---|---|
| JP | H0963734 A | 3/1997 |
| JP | H11312727 A | 11/1999 |
| JP | 2006179629 | 7/2006 |
| JP | 2011-181873 A | 9/2011 |
| KR | 10-2015-0003978 A | 1/2015 |
| TW | 201417137 A | 5/2014 |
| WO | WO2007043528 A1 | 4/2007 |
| WO | WO2010016588 A1 | 2/2010 |
| WO | WO2012011149 A1 | 1/2012 |
| WO | WO 2016/137964 A1 | 9/2016 |

\* cited by examiner

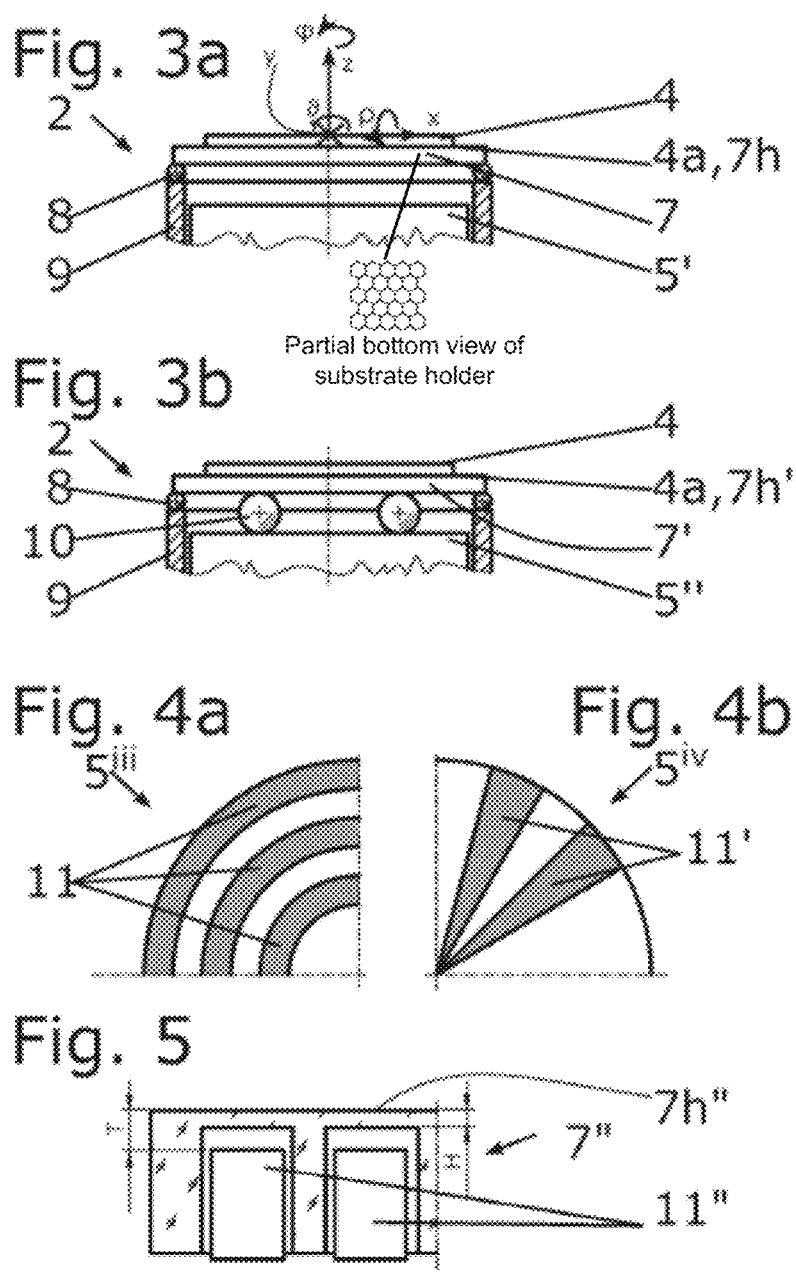

ELECTROSTATIC SUBSTRATE HOLDER

FIELD OF THE INVENTION

The present invention relates generally to handling of substrates and more particularly to an electrostatic substrate holder for accommodating and holding a substrate, to a method for processing a substrate, and to a processing plant.

BACKGROUND OF THE INVENTION

The market demands for higher performance electronic devices necessitates novel production and processing methods for the corresponding functional units. This performance can be defined in terms of increased computing capacity, in terms of more sensitive sensors, such as image capture, faster and larger memory components, but also larger switching currents or higher frequencies in the case of IGBT elements, brighter, colourful or more colourful LEDs.

In most cases, increased performance comes about with increased energy conversion, as a result of which the heat losses likewise turn out to be higher. In order to prevent overheating, on the one hand cooling, on the other hand reducing the volume and elevating the surface are expedient. Reducing the volume of chips is technologically limited in the lateral direction, as the miniaturization cannot be advanced as desired. The physical framework parameters arise more and more as hard boundaries of the individual technologies. In order to reduce the chip volume, it is a sensible step to make the chips and/or the carriers, also termed substrates, thinner.

The thinner a substrate is, the more brittle it is. The brittleness places particular requirements on the handling of the substrates. In order to prevent substrate fractures, and to enable mass production, particular measures are required, which include holding the substrate and processing.

Back-thinned substrates must be brought to the original, preferably planar, shape and held in shape, because back-thinned substrates without support assume individual shapes and can even roll up. Reason for this is that the local atomic conditions cannot be controlled and also influence the shaping by means of mechanical stress states.

The definition of a plane may take place in the mathematical sense or in terms of semiconductor technology according to SEMI standards, which determines the permitted deviations in the context of tolerances. These definitions are already known to the person skilled in the relevant art.

Industry has also developed a plurality of approaches and solutions under the names substrate handling or holding device for fastening and straightening deformed substrates. Compare the use of carrier substrates, cf. U.S. Pat. No. 8,449,716B2 and the associated assembly and connection technologies.

A few disadvantages of the prior art are covered in the following. Most holding devices in the prior art are not suitable for a vacuum or only suitable for a vacuum to a limited extent.

One possibility of a holding device uses chemical adhesion for fastening the substrate on a carrier. For technological steps, which are executed at elevated temperatures (above 200° C., preferably above 300° C., particularly preferably above 350° C., very particularly preferably above 400° C.) and/or in a vacuum, the use of, in particular, outgassing polymer compounds and/or adhesives, and/or solders is disadvantageous.

A further option for a holding device is the holding of the substrates or a substrate, particularly a back-thinned substrate, by means of weak atomic forces and/or surface adhesion. The adhesion of the thin substrate on the carrier and detachment poses a challenge, particularly for applications at elevated temperatures and/or in a vacuum.

A further option is mechanically fastening an in particular back-thinned substrate. The holding force can be created by means of grippers. However, this is often not desired due to cleanness criteria and the sensitivity of the structures produced.

A further embodiment of the holding device in many cases uses fluidic force generation, wherein either flow conditions with pressure differences are created, so that the external pressure presses the substrate on the holding device. Bernoulli actuators using air cushions or suction holding surfaces may be used. The embodiments and design of such systems are known to the person skilled in the relevant art.

One can see that each of the holding devices mentioned has at least one disadvantage when used in a vacuum.

The effects of electrostatics have for a long time been used in the art, particularly for fastening relatively small and light workpieces. The Coulomb interaction or the Johnsen-Rahbek effect (cf. U.S. Pat. No. 1,533,757) are used in this case. As is known, material properties of insulators, conductors and semiconductors and also electrical charges are used to generate forces, particularly holding forces, without electrical charges "flowing" in the process.

For workpiece fastening, the electrostatic holding force is used for example in printing technology or when plotting smaller curves; likewise, drum recorders with electrostatic media fastening (paper) may be considered to be known prior art.

In the semiconductor industry, particularly substrate processing in a vacuum, preferably high- or ultra-high-vacuum plants, it is conventional to fasten substrates by means of simple electrostatic substrate holders. Substrate holders of this type are used for example in ion implantation plants. Plants of this type can rotate the substrate or the substrates at certain angles, cf. US2014/0290862 A1. Furthermore, a degree of translational freedom can likewise be considered as an extension of a substrate holder, cf. US2015/0170952A1. Detaching the substrates from the holders has already been investigated appropriately cf. DOI: 10.1585/pfr.3.051 and the relationships of the substrate material with the electrostatic holding force, cf. DOI: 10.1063/1.2778633.

The prior art therefore discloses substrate holders, which fasten substrates by means of electrostatic holding forces and allow up to three degrees of freedom (two tilting axes and one translation axis).

In the prior art, electrodes are used for generating the electrostatic holding forces, which electrodes are accommodated on the surface of the substrate holder or in the volume of the substrate holder and accordingly also carry out all movements to which the substrate is exposed during processing. Sliding contacts are used for contacting the said electrodes.

However, the executable movement procedures are limited using the plants of the prior art. The substrates which are held, are held electrostatically in the known substrate holders. However, these do not allow a complete repeatable rotation, which could occur without discharging particles, as the contacting of the electrostatic holding surface is executed by means of sliding contacts. The sliding contacts always create particle abrasion, which has a disadvantageous effect for high-vacuum plants or plasma plants in particular.

SUMMARY OF THE INVENTION

It is an object of the present invention to provide an improved electrostatic substrate holder. In particular, the undesired particle abrasion during rotation should be minimized or even prevented. In addition, the movability of the holder should be improved.

This object is achieved with the subject matter of the coordinate patent claims. Advantageous developments of the invention are specified in the dependent claims. All combinations of at least two features specified in the description, the claims and/or the figures also fall within the scope of the invention. When value ranges are specified, values lying within the limits mentioned should also be disclosed as limit values and be claimable in any desired combination.

An electrostatic substrate holder according to the invention (also termed sample holder or holding device in the following) for accommodating and holding a substrate has:

a rotor, having a holder with a holding surface for fixing the substrate on the holding surface (also termed fixing area or fixing surface in the following), a stator for accommodating and mounting the rotor, electrodes for generating an electrostatic holding force for fixing the substrate, wherein the stator has the electrodes.

The embodiments of the holding device according to the invention may handle any substrate, independently of the diameter thereof.

In than accordance with one aspect of the present invention, electrodes are not located on the holding surface, but rather are located on and/or in the stator.

The invention furthermore relates to a processing plant, having a processing apparatus for processing a substrate and an electrostatic substrate holder according to the invention for holding the substrate. All aspects of the substrate holder according to the invention therefore also apply for the processing plant.

The invention in particular consists in the electrodes being located not on the holding surface, but rather on and/or in the stator.

The advantage of the invention in particular is that the substrate holder according to the invention can be designed without sliding contacts. As a result, undesired particle abrasion during the rotation is minimized or even prevented, which is advantageous for high-vacuum plants or plasma plants in particular.

The particle number in a processing chamber, in which the sample holder is located, is reduced considerably; this keeps the surface of the fixed substrate or the sample holder according to the invention clean.

The electrostatic substrate holder according to the invention decouples the electrostatic holding property from the mechanical movement apparatus, so that by dispensing with sliding contacts of the electrostatics of the substrate holder, a reduced, preferably minimal, particle discharge is generated.

Furthermore, a further and additional contamination of the sample holder by a more or less encapsulated construction is avoided or at least greatly reduced.

Advantages of the invention are the reduced discharged particle quantity due to the avoidance of sliding parts and extension of the executable, reproducible movement procedures.

The stator also includes the part termed the electrostatic or electrical module. The rotor also includes the part termed the mechanical module. The object according to the invention of holding and moving the substrate is achieved by means of the synergistic effects and cooperation of the stator and rotor, that is to say the interaction of the mechanical module and the electrostatic module.

The present invention relates to an electrostatic substrate holder having a rotatable holder and stationary electrodes, which are not entrained in rotation.

Primarily, the electrostatic substrate holder according to the invention is used in vacuum, high-vacuum and/or ultra-high-vacuum plants with high requirements for cleanness and freedom from particles.

The following stipulations should be met: The Z direction or Z axis runs perpendicularly or as a surface normal to the holding surface. The X, Y directions or axes run perpendicularly to one another and parallel to or in the holding surface of the holder.

A rotation about the x axis is labelled with p, a rotation about the y axis is labelled with 3 and a rotation about the z axis is labelled with cp.

In a preferred embodiment, the rotor is mounted by means of electrically conductive bearing elements, particularly ball bearings and/or deep groove ball bearings and/or angular contact ball bearings and/or spherical roller bearings and/or axial bearings and/or radiax bearings. Due to the electrical conductivity, the electrostatic force can in particular advantageously be exerted onto the substrate particularly efficiently.

In a different preferred embodiment, it is provided that the electrically conductive bearing elements touch the electrodes of the stator. As a result, the electrostatic force can advantageously be exerted particularly efficiently onto the substrate in particular.

In a different preferred embodiment, it is provided that the thickness of the holder in the Z direction is less than 100 mm, preferably less than 50 mm, particularly preferably less than 10 mm, very particularly preferably less than 5 mm. As a result, the distance between the electrodes and the holding surface can be reduced, so that the holding force is optimized.

In a different preferred embodiment, it is provided that the distance between the electrodes and the holding surface is less than 100 mm, preferably less than 50 mm, particularly preferably less than 10 mm, very particularly preferably less than 5 mm. In a different embodiment, the distance between the electrodes and the holding surface is less than 3 mm, preferably less than 1 mm, particularly preferably less than 100 micrometres. With such a small distance, the holding surface can be improved further.

In a different preferred embodiment, it is provided that depressions are arranged on the side of the holder facing away from the substrate, in which depressions the electrodes are arranged, wherein the depressions are constructed concentrically and/or as channels in particular. As a result, the spacing between the electrodes and the holding surface can be reduced. In addition, the electrodes can be distributed optimally, in order to generate a desired and in particular evenly distributed holding force.

In another preferred embodiment, it is provided that the electrodes are constructed as rings, in particular, the rings are arranged in an equidistant and/or concentric manner. Thus, the electrodes can be distributed optimally, in order to generate a desired and in particular evenly distributed holding force.

In a different preferred embodiment, it is provided that the electrodes are constructed as circle sectors and/or circular ring sectors. Thus, the electrodes can be distributed optimally, in order to generate a desired and in particular evenly distributed holding force.

In a different preferred embodiment, it is provided that the holder is constructed as a honeycomb structure. As a result, the generation of the holding force can be improved even further.

In a different preferred embodiment, the substrate holder has a positioning, holding and movement system for moving the substrate and/or the holder. This advantageously facilitates carrying out the movements of the substrate and/or the holder.

In a different preferred embodiment, it is provided that the substrate and/or the holder can be moved in at least three degrees of freedom, preferably in at least four degrees of freedom, preferably in at least five degrees of freedom, most preferably in all six degrees of freedom. This allows an improved movability of the substrate and/or the holder.

In a different preferred embodiment, it is provided that the positioning, holding and movement system is constructed for at least one degree of freedom using a coarse drive and a fine drive. This advantageously allows exact adjustment of the movements.

In a different preferred embodiment, it is provided that the drives of the positioning, holding and movement system are configured in such a manner that in a non-moved state without operating voltage and/or current and/or other power supply, they can maintain the respective position and/or stop. This advantageously allows holding the substrate and/or holder in a defined position.

In a different preferred embodiment, it is provided that the substrate holder has a central control unit and/or regulating unit for controlling and/or regulating movements and/or procedures, particularly the fixing of the substrate, the position of the holder, the speeds and/or the accelerations of the holder. This advantageously allows improved adjustment of the desired parameters.

In another preferred embodiment, it is provided that the substrate holder has at least one sensor for measuring influencing factors, particularly a distance and/or position sensor, and at least one actuator for controlling and/or regulating as a function of the measured influencing factors, particularly a position encoder and/or angle encoder. This advantageously makes it possible for an investigation of the influencing factors and an optimum adjustment of the movements to take place in a control loop.

The substrate holder according to the invention has at least three, most preferably at least four, most preferably of all at least five degrees of freedom of movement.

The substrate holder according to the invention allows 360° rotations about the three axes of rotation. The electrodes are not rotated according to the invention. Thus, the movements about the three axes of rotation are in each case decoupled from the electrical and/or electronic functions.

As no cables for power supply lead into the holder, the holder can be moved in all directions and/or rotated about all axes.

Due to the separation according to the invention between electrostatic and mechanical functions, there are few to absolutely no double functions of electrostatic and mechanical nature: electrostatic components undertake electrostatic functions such as charge transport or insulation and electrostatic force generation, wherein the holding surface of the substrate holder exclusively is electrostatically charged by means of the charge separation. Mechanically loaded parts, such as drives or guides or bearings can be substantially free from connected electrical potential. The support function of the holding surface forms a mixed form, as the functionality is created by means of the electrostatic force.

Due to the function separation, a simplification of the design and the manufacturing outlay of the components and modules can be achieved, which has a positive effect on the cost structure of the substrate holder and/or the plant as a whole.

The substrate is preferably a wafer, particularly a semiconductor wafer. Wafers are standardized substrates with well-defined, standardized diameters. However, the substrates can generally have any desired shape. The diameters can generally take on any desired size, but for the most part have one of the standardized diameters of 1 inch, 2 inches, 3 inches, 4 inches, 5 inches, 6 inches, 8 inches, 12 inches and 18 inches or 25.4 mm, 50.8 mm, 76.2 mm, 100 mm, 125 mm, 150 mm, 200 mm, 300 mm, 450 mm or larger.

In the remainder of the description, mention is generally made of substrates. In particular, however, the embodiments according to the invention predominantly relate to wafers, particularly semiconductor wafers.

Substrate Holder According to the Invention

The present invention relates to an electrostatic substrate holder, which has a rotatable holder and stationary electrodes, i.e. electrodes which are not entrained in rotation.

The electrodes can generally be understood as electrostatic module and the holder can be understood as mechanical module.

According to the invention, the electrostatic module is substantially, particularly completely, decoupled from the mechanical module.

The electrostatic substrate holder according to the invention decouples the electrostatic holding property from the mechanical movement apparatus. In other words: the functions of the electrostatic module and of the mechanical module are substantially, particularly completely, separated from one another.

For a substrate holder according to the invention, which is used in particular in a processing plant, particularly a high- and/or ultra-high-vacuum plant, the effect of the electrostatics is used for holding force generation.

Two effects of the electrostatics are of particular importance: the Johnsen Rahbek effect and the Coulomb effect.

By means of one of the effects of the electrostatics mentioned, the substrate is fastened at a defined position on the substrate holder according to the invention, the so-called holding surface. The holding surface is a surface of a holder, which is designed for substrate fastening, preferably realized in a planar manner, and is installed as a component in the substrate holder.

In the following, the planarity is used as a measure for the perfection of a planar area, particularly a surface. Deviations from a planar surface result due to microscopic and/or macroscopic faults of a mathematically ideal plane.

These faults can also be defined as ripples and roughnesses. The rippling of a surface stands out by means of a certain periodic rising and falling of the surface, particularly in the millimetre range, less often in the micrometre range. By contrast, roughness is a rather aperiodic phenomenon in the micrometre or nanometre range.

The precise definition of surface properties of this type is known to any person skilled in the art of surface physics, tribology, mechanical engineering or materials sciences.

In order to cover the different deviations from the ideal surface, the term roughness can be used synonymously for covering all effects of this type in the remainder of the description. The roughness is either specified as mean roughness, root mean square roughness or as mean roughness depth.

The determined values for the mean roughness, the root mean square roughness and the mean roughness depth generally differ for the same measured distance or measured area, but lie in the same order of magnitude. Therefore, the following ranges of numerical values for the roughness are to be understood either as values for the mean roughness, the root mean square roughness or for the mean roughness depth.

The roughness is in this case smaller than 100 μm, preferably smaller than 10 μm, more preferably smaller than 1 μm, most preferably smaller than 100 nm, most preferably of all smaller than 10 nm.

The values and parameters listed for the roughness apply as a macroscopic variable for the planarity analogously to DIN ISO 2768-2 tolerance class H and better.

Two physical effects of the electrostatics, which are important for understanding the embodiments according to the invention, are covered in more detail in the following.
Force Generation by Means of the Coulomb Effect/Johnsen-Rahbek Effect By applying a potential difference between two electrodes, charges of opposing polarity are created on the surfaces thereof. An electrical field builds between the charged surfaces.

In the electrostatic substrate holder, the electrodes are laid parallel next to one another in particular, so that the electrical field is built in an arc from the one electrode to the other electrode. If a substrate comes into contact with this electrical field, charges on the substrate surface are influenced and/or orientated by means of orientation polarization.

In each case, the substrate surface facing an electrode is charged with opposing polarity. Due to the opposing polarity charge on the substrate surface and the electrode, the two are attracted to one another.

If the electrodes are located in or below the holder, then the electrical field generated by the electrodes also flows through the holder. If the holder is designed as a dielectric, there may be no charge flow in the holder.

The holder can therefore induce a corresponding surface polarization on the holding surface as a function of the relative dielectric constant thereof, which surface polarization can then be considered as the actual source for the polarization of the substrate surface.

Electrical insulators such as $SiO_2$ and/or non-conductive ceramics can preferably be used as materials of the holder. Further materials, particularly materials suitable for high or ultra-high vacuum, such as glasses, glass ceramics, carbides, nitrides and/or other dielectrics are possible.

The special feature of the invention lies in equipping the electrostatic substrate holder with electrodes, which are not entrained in rotation and are spaced from the holding surface and are designed without galvanic contact thereto, and in the electrically insulating mechanical construction. As a result, the moved mechanical parts are completely galvanically and spatially decoupled from the electrostatic modules, which are relevant for holding force generation.

A different effect is the Johnsen-Rahbek effect. The effect makes use of the weakly conductive holder, through which the electrical field of the electrodes likewise flows. However, due to the weak conductivity of the holder, no orientation polarization occurs due to the electrical field, rather a charge flow to the surface occurs.

These charges can then be considered as the actual source for the polarization of the substrate surface. In the event of contacting with a different dielectric, small gaps occur as a consequence of the unevennesses in the surfaces of the two contacting objects, between which gaps very large field strengths can be generated.

The very large force generated thereby is termed the Johnsen-Rahbek force and likewise leads to attraction between the substrate and the holder. If the holding force is generated with the Johnsen-Rahbek effect, the holder as weak electrical conductor can in particular drain induced charges of the substrate.

In this case, the weakly electrically conductive holding surface (i.e. the holder) is contacted in an electrically conductive manner with the electrostatic modules. This electrostatic contacting of the holder can take place at a side facing away from the substrate to be held. The different embodiments of the substrate holder using the Johnsen-Rahbek effect as holding force are covered in detail at a later time.
Mechanical Module, Independent Degrees of Freedom In a different preferred embodiment, the electrostatic substrate holder has a positioning, holding and movement system for moving the substrate and/or the holder.

In a different preferred embodiment, the substrate and/or the holder can be moved in at least three degrees of freedom, preferably in at least four degrees of freedom, more preferably in at least five degrees of freedom, most preferably in all six degrees of freedom.

In particular, independently of the embodiment according to the invention of the electrostatic holding force generation of the substrate holder, the mechanical positioning, holding and movement system for all six independent degrees of freedom of the substrate can be used for carrying out the required movement procedures of the processing of the substrate, for which the substrate holder is used. One possible division is as follows:

According to the invention, up to five degrees of freedom of movement, which the movements according to the invention carry out during the processing of a substrate, can be used. The sixth degree of freedom is blocked, particularly electrostatically, by means of the substrate holder, so that the substrate is not moved independently of the substrate holder. This sixth degree of freedom can in particular be executed during loading and/or unloading of the substrate.

In a different preferred embodiment, the positioning, holding and movement system is constructed for at least one degree of freedom using a coarse drive and a fine drive.

In particular, composite movement systems for a degree of freedom (translation or rotation) can be used. A composite movement system executes the movement of a degree of freedom as a plurality of units. For example, a coarse drive and a guide in a translation direction and a fine drive and a guide in the same can be understood as a composite drive for a degree of freedom.

In a different preferred embodiment, the drives (coarse and/or fine drives) of the positioning, holding and movement system are configured in such a manner that in a non-moved state without operating voltage and/or current and/or other power supply, they can maintain the respective position and/or stop. In other words, self-holding drives including guides and/or bearings are preferably used.

The particular advantage lies in the lower heat development without movement and thus avoidance of parasitic heat sources, which make the thermal management difficult, particularly in a vacuum or high vacuum or ultra-high vacuum.

According to the invention, it is possible in particular that the substrate holder executes four or fewer degrees of freedom of the substrate: then the plant should execute the missing degrees of freedom in a targeted manner.

A Cartesian coordinate system is preferably introduced for the definition of the degrees of freedom and the spatial directions. The origin of the coordinate system is preferably placed in the centre point of the holding surface of the holder of the substrate holder and is defined as fixed and non-movable.

During movements of the holder and the entire substrate holder, the coordinate system is therefore not entrained in movement and/or rotation. In the case of highly symmetrical holding surfaces, the centre point is understood as a geometric centre point, in the case of holding surfaces which are not highly symmetrical, the centre point is understood as the centre of gravity.

As already determined above, the x direction or x axis and the y direction or y axis run on the holding surface, the z direction or z axis is defined as surface normal to the holding surface. It is possible in particular to transform the origin of the coordinate system at each desired point of the plant or to define further coordinate systems.

A rotation about the x axis is labelled as $\rho$, a rotation about the y axis is labelled as $\vartheta$ and a rotation about the z axis is labelled as $\varphi$.

In the present disclosure, the movement directions are understood generally, so that the rotation and/or translation directions and also origins of the movements do not have to fall on the coordinate axes, but rather can be described by means of mathematical transformations in the coordinate system; this is not described in detail, as this is known to the person skilled in the art.

In addition to the main function of the substrate holder, to hold the substrate, the secondary function, to enable movement procedures, is likewise integrated into the substrate holder as a design feature.

In order to enable the required movement procedures for the at least three, preferably four, particularly preferably five degrees of freedom, high requirements are placed on the precision of the mechanical, movable components. Precise, particularly play-free and/or backlash-free, prestressed bearings and guides and also drives are used for the purpose.

The degrees of freedom listed are as viewed from the substrate in particular.

1st Degree of Freedom:

It is expedient for considering the independent degrees of freedom to understand the movement directions, that is to say the degrees of freedom from the substrate to the framework, which is not moved, as a movement chain.

The movement chain as viewed from the substrate can in a first embodiment according to the invention generate a translation, that is to say a linear movement. The direction of this first translation can be carried out in the z direction. This can be carried out technologically in a justified manner for equipping and substrate change.

If the substrate holder should not lift the substrate, but rather in particular, the substrate should be removed from the substrate holder by edge grippers, this degree of freedom of the substrate holder can be transferred to the plant and is dispensed with for the substrate holder.

2nd Degree of Freedom:

The rotation about the z axis can take place as the next movement of the substrate. The bearings and drives necessary for that and the embodiments thereof are listed later.

1 st and 2nd Degree of Freedom:

If the movements necessary for substrate processing cover a plurality of independent degrees of freedom, the drives, bearings and/or guides, which execute the movement, can be built in a modular construction and be understood as subsets of the mechanical module. The modules execute movements with more than one independent degree of freedom. Therefore, translations, as in the case of cross tables in particular, or at least one translation and a rotation or two rotations, can be combined in a module. Thus, in a further embodiment according to the invention, a combination as lifting/rotation module or rotation/lifting module is possible.

In a different preferred embodiment, the combination of the rotation/lifting module is comprised of a rotatable holding surface of the holder of the mechanical module of the substrate holder provided with openings and/or holes and/or slots, and linearly movable surfaces, pads and/or pins for lifting and/or lowering the substrate.

In an exemplary embodiment, the number of movable pins and/or surfaces is at least 2, preferably at least 3, particularly preferably at least 4, very particularly preferably at least 4.

3rd Degree of Freedom and/or 4th Degree Freedom

Rotations about the x-axis and/or the y-axis can be carried out as third and/or fourth degree of freedom. In this case, the rotation axes of the respective movement can be understood with any desired coordinate transformation of the origin.

If the x- and/or y-axis falls on the surface of the substrate to be processed facing away from the holding surface, it is possible to achieve an error tolerance of the rotations of the third and/or fourth independent degree of freedom by applying the design principles of innocence and invariance. Both design principles create a functional group which is at least low in errors (innocence), if not inherently free from errors (invariance) under certain circumstances.

By means of an innocent, low-error arrangement of the rotation axes, particularly by means of a cardanic suspension and/or a spherical calotte design, which are known to the person skilled in the art, it is possible to overcome first-order errors of the positioning constructively. In other words, this leads to the reduction of tilting errors.

During vapour deposition, sputtering and/or during ion treatment (removal of the surface, and/or amorphization and/or ion implantation) and/or a radical treatment with plasma in particular, tilting errors cause irregularities and/or defective productions, which often leads to segregation from the manufacturing chain, with subsequent inspection and disposal of the substrate.

5th Degree of Freedom and/or 6th Degree Freedom

In a different preferred embodiment according to the invention of the substrate holder, exact positionability and movability of the substrate holder along the coordinate axis directions x and or y is ensured.

If no division of the relative movements of the system made up of the processing apparatus and substrate holder has taken place, the substrate fastened on the holding surface is moved in particular in a recipe-controlled and/or recipe-regulated manner.

Mechanical Module

A processing plant according to the invention points to at least one processing apparatus for processing the substrate, which is held by the substrate holder.

If movements are necessary for processing and/or for handling, the required independent degrees of freedom can be carried out by the processing apparatus and/or by the substrate holder. Thus, a division of the independent degrees of freedom between the processing apparatus and the substrate holder is advantageously possible.

In an exemplary preferred embodiment according to the invention, the processing apparatus can be adjusted by means of tilting and/or yawing, that is to say adjustment of the angular position, as a result of which movement as translations of a processing beam on the substrate in particular results.

In another, particularly preferred, embodiment according to the invention, the six degrees of freedom of the substrate in relation to the processing apparatus are divided such that the substrate holder can execute a translation, particularly in the x-direction, and a rotation about the y-axis and a rotation about the z-axis. The further degrees of freedom are taken over by handling robots and/or grippers and/or handing devices integrated into the plant and/or the movements of the processing source.

In another preferred embodiment, the six degrees of freedom of the substrate in relation to the processing apparatus are divided such that the substrate holder can execute a translation, particularly in the x-direction, a further translation, particularly in the z-direction for adjusting the height of the substrate on the holding surface, and also a rotation about the y-axis and a rotation about the z-axis.

In another preferred embodiment, the six degrees of freedom of the substrate in relation to the processing apparatus are divided such that the substrate holder can execute two translations, particularly in the x-direction and in the y-direction, and a further translation, particularly in the z-direction for adjusting the height of the substrate on the holding surface, and a rotation about the y-axis and a rotation about the z-axis.

According to the invention, the translation movement in the x-direction and/or in the y-direction cover a travel distance greater than 100 mm, preferably greater than 150 mm, particularly preferably greater than 300 mm, very particularly preferably greater than 450 mm.

The distance data can also comprise +/− half a distance, for example +/−50 mm.

For the translation in the z-direction, a travel distance greater than 5 mm, preferably greater than 10 mm, particularly greater than 30 mm, should be possible.

The positioning accuracy of the translations should reach less than 5 mm, preferably less than 1 mm, particularly preferably less than 0.1 mm, very particularly preferably less than 0.01 mm, in the optimum case less than 50 micrometres, in the ideal case less than 50 nm.

For the rotations ϑ and/or ρ, it should be possible freely to set tilt angles of less than 181 degrees, preferably less than 91 degrees, particularly preferably less than 61 degrees, in the optimum case less than 31 degrees, in the ideal case less than 21 degrees.

The angular data can also comprise +/− half of the angular data, for example +/−90.5 degrees.

The tilt errors for the rotations ϑ and/or ρ and/or φ should (expressed as a distance at the respective edge or diameter of the holding surface as a tilt height) be less than 5 mm, preferably less than 2 mm, particularly preferably than 1 mm, very particularly preferably less than 0.1 mm, in the optimum case less than 0.01 mm and in the ideal case less than 0.001 mm. In other words, the specified distance is a distance for the position which is to be reached nominally or ideally.

For the rotation φ, same-direction or alternating-direction rotations of greater than 360 degrees should be possible.

Control/Regulation

According to a different preferred embodiment, a central control unit and/or regulating unit is arranged for controlling and/or regulating movements and/or procedures, particularly the fixing of the substrate, the position of the holder, the speeds and/or the accelerations of the holder.

The control and/or regulation of the movements and/or procedures, particularly the fixing of the substrate, the position of the substrate holder with the substrate in the plant, the speeds and/or the accelerations, preferably takes place via the central control unit and/or regulating unit, particularly a computer with a control software and/or regulation software.

The (recurring) control and/or regulation procedures can be combined as recipes and in particular may be present as machine-readable code. Recipes are optimized value collections of parameters, which exist in the functional and/or procedural context. The use of recipes makes it possible to ensure a reproducibility of production procedures.

According to a different preferred embodiment, at least one sensor is arranged for measuring influencing factors and at least one actuator is arranged for control and/or regulation as a function of the measured influencing factors.

For regulation and/or control, the use of corresponding sensors can be provided in addition to the use of an active element (the actuator). These sensors are used in particular in order to ensure recording and/or processing and/or forwarding of the influencing factor to be measured. In particular, distance and/or position sensors (position encoders and/or angle encoders) and/or electrical current and/or electrical voltage can be used as regulating variables.

To determine the position of the substrate holder in the plant, optical means, and/or inductive and/or capacitive and/or fibre-optic and/or mechanical and/or magnetic and/or magnetostrictive sensors such as distance encoders, runtime measuring devices (laser triangulation) and/or interferometers can be used.

The methods used for length measurement, modified for rotation, such as incremental encoders and/or absolute encoders can be used for determining the rotations.

So that feedback about the electrostatic fastening of the substrate takes place, optical means for reflection measurement and/or camera systems for edge detection and/or image processing and/or pressure sensors can be used.

In a further embodiment, the changes of the electrostatic variables can be observed and regulated accordingly in order to maintain the holding force.

Preferably, the variable to be measured should cause a change of the, in particular, electrical properties of the measured variable, so that an electronic detection, forwarding and machine, particularly computer-aided, processing of the measurement result and/or the signal can take place.

Mounting of the Rotor

In another preferred embodiment of the substrate holder, the rotor is mounted by means of electrically conductive bearing elements, particularly ball bearings and/or deep groove ball bearings and/or angular contact ball bearings and/or spherical roller bearings and/or axial bearings.

Commercially Available Bearings of Corresponding Diameter can be Used.

The bearings and/or guides can in particular advantageously be constructed such that they are suitable for vacuum, preferably high vacuum, particularly preferably ultra-high vacuum.

In a preferred embodiment, the electrically conductive bearing elements touch the electrodes of the stator. Thus, the bearing elements extend the electrodes up to as close as possible to the side of the holder opposite the holding surface.

In particular, conductive balls, which are constructed as part of a ball bearing, can touch the electrodes attached at the stator.

In particular, deep groove ball bearings and/or angular contact ball bearings and/or spherical roller bearings and/or axial bearings can be used. In special cases, the use of simple cylindrical bearings is conceivable, if abrasion behaviour and rolling behaviour allow this.

According to the invention, an in particular constant rotational speed or a variable rotational speed, coupled to a regulation or control, of greater than 0.1 rotations/minute (rpm), preferably greater than 1 rpm, particularly preferably 10 rpm, very particularly preferably greater than 50 rpm, in the optimum case greater than 65 rpm, in the ideal case greater than 100 rpm, is created. However, rotational speeds of less than 0.1 rpm and/or a standstill are also possible.

So that the plant, in which the substrate holder is installed, can achieve corresponding process results, not only the rotational speed of the rotation φ, but rather also the angular acceleration is of central importance. The angular acceleration is a core parameter for the uniformity in particular, as a uniform state can be reached faster. In particular, the angular acceleration is more than $1 \text{ rad/s}^2$, preferably more than $10 \text{ rad/s}^2$, further preferably more than $100 \text{ rad/s}^2$, even further preferably more than $1000 \text{ rad/s}^2$, particularly preferably more than $10000 \text{ rad/s}^2$.

According to the invention, an, in particular, multi-axial rotation can be carried out by means of the substrate holder for positioning substrate zones and/or regions in the processing plant. For positioning accuracy, a controlled and/or a regulated movement is arranged, so that it is possible to travel to a desired angular position.

Thus, for a controlled rotation about the z axis in particular, a full 360° rotation can be divided into $2^n$ parts. In particular, n should be larger than 1, 2, 3, 4, 5, 6, 7, 8, 9, 10, 11, or 12. Thus, a corresponding positioning-related angular error of less than 10 degrees, 5 degrees, 1 degree, 0.1 degree, 0.01 degree can be achieved.

In another preferred embodiment of the substrate holder, a radiax bearing, also termed a radial-axial bearing, can also be used. Due to the multifarious over-determination of the rotation behaviour and/or run-in capability and/or adjustable prestress of the bearing elements and/or use of (abrasion-optimized) wire cages for overcoming play and/or freedom from wobbling of the rotation and also due to the free configurability of the diameter of the bearing, this embodiment is particularly advantageous.

Thus, the electrostatic module can be attached, below the substrate and the holder in particular, in a property-optimized, particularly holding-force-optimized and/or distance-optimized, manner.

Design of the Holder and Arrangements of Electrostatic and Mechanical Modules

The holder has a key role for the function of the substrate holder both electrostatically and mechanically.

The holder is part of the mechanical module, as the holder holds the substrate clamped on the holding surface by means of electrostatic holding force. The holder is also part of the electrostatic module, because the electrostatic holding force through the holder fastens the substrate.

Properties of the holder, which are relevant according to the invention, include the inherent stability, the dielectric properties, the purity, thermal expansion, heat capacity, thermal conductivity and also the corrosion resistance.

Furthermore, the arrangement (positions, distances, orientation) of the holder in relation to the other parts of the electrostatic module and mechanical module is important.

According to the invention, it is advantageous for the substrate holder to minimize the distance of the substrate from the fixed electrodes which are not entrained in rotation: as a result, the electrostatic field strength is accordingly reduced proportionally. The minimized electrostatic field strength is advantageous for an easier detachment of the substrate from the substrate holder, as a result of which the productivity of the processing plant is increased.

Insofar as the inherent stability of the holding surface allows this, the thickness of the holder in the z-direction or perpendicularly to the holding surface is less than 100 mm, preferably less than 50 mm, particularly preferably less than 10 mm, in the ideal case less than 5 mm.

In a different embodiment of the holding surface, the thickness of the holder in the z-direction or perpendicularly to the holding surface is less than 30% of the diameter of the holder, preferably less than 10% of the diameter of the holder, particularly preferably less than 5% of the diameter of the holder, very particularly preferably less than 1% of the diameter of the holder, in the ideal case less than 0.5% of the diameter of the holder.

The thickness of the holder H relates to a measurement point on an electrode. For technological reasons, the holder can have inherently different thicknesses. The holder can also be designed as a plate with non-homogeneous thickness, so that rigidity-optimized designs, particularly fields coupled as a result of FEM analyses, can be used for shaping. For the inherent stability and/or function integration in particular, the holder can have technologically related edge reinforcement in the z-direction. The edge reinforcement can therefore be more than 1 mm, preferably more than 4 mm, particularly preferably more than 9 mm. In preferred embodiments, there may be a free gap height between the electrodes and the surface of the holder, which is not on the substrate side.

In particular embodiments, the distance between the fixed electrodes, which are not entrained in rotation, and the surface of the holder, which is not on the substrate side, is less than 1 mm, preferably less than 500 micrometres, particularly preferably less than 200 micrometres, in the optimum case less than 100 micrometres, in the ideal case less than 10 micrometres.

In a further preferred embodiment, concentric depressions, particularly channels, can be formed on the side of the holder facing away from the substrate, in which depressions the electrodes, particularly with a minimal free distance from the holder, are arranged, so that the distance of the electrostatic electrodes from the substrate can be minimized. Thus, there may be a distance in the channels, between the surface of the holder, which is not on the substrate side, and the electrodes, of less than 1 mm, preferably less than 500 micrometres, particularly preferably less than 200 micrometres, in the optimum case less than 100 micrometres, in the ideal case less than 10 micrometres.

It is provided in a further preferred embodiment to realize this not as a monolithic block, but rather in particular as a rigidity-optimized honeycomb structure. The holding surface is planar and realized in a full-surface manner. On the side facing away from the holding surface, the holder has a material which is reinforced, particularly in terms of the thickness, which material is realized in a strut- or rib-like manner such that it creates hexagonal honeycomb structures in particular. Thus, the height of the holder can be reduced for identical mechanical rigidity. This is important for the dielectric properties and for the electrostatic field strength used.

In a further preferred embodiment, the holder is rigidity-optimized, particularly realized with honeycomb structures, wherein the side facing away from the substrate can be realized with planes at different levels in particular, and wherein the holder has concentric depressions for accommodating the electrodes. The calculations required for this can be realized as approximation by means of the finite element method (FEM).

Electrode Designs

In a preferred embodiment, the electrodes are constructed as rings, in particular, the rings are arranged in an equidistant and/or concentric manner.

In a different preferred embodiment, the electrodes are constructed as circle sectors and/or circular ring sectors.

The electrodes are preferably galvanically insulated from one another.

In a further preferred embodiment of the substrate holder, the electrodes can be galvanically insulated from one another and in particular realized in an equidistant manner in each case from the rotational axis of rotation φ as concentric rings.

The number of circle sectors, ring sectors and/or rings are to be determined as a function of the number of electrodes. The electrodes are divided into sources and drains for the electrostatic force generation. Thus, there should be at least one source and at least one drain. The design of the number of electrodes is known to the person skilled in the art of electrical engineering and electronics. In particular, there are at least two electrodes, preferably more than 5 electrodes, more preferably more than 10 electrodes, most preferably more than 20 electrodes.

Preferably, DC voltage is applied at least at one electrode pair for fastening the substrate on the holding surface. The voltage lies between 0.1 kV to 10 kV, preferably 0.4 kV to 5 kV, particularly preferably between 0.5 kV to 4 kV, very particularly preferably between 0.6 kV to 3 kV.

In a preferred embodiment, the set electrical voltage for holding force generation is set in a regulated manner in particular, so that a temperature dependence of the holding force can be set. Thus, an optimum of the holding force is used, which results from the parameters temperature curve, holding force and electrical voltage.

For a constant electrical voltage, the holding force is increased at elevated temperature, so that a destruction-free detachment of the substrate from the substrate holder is no longer possible.

It is presumed that the electrical voltage for holding force generation runs in an inversely proportional manner in the curve for temperature increase. Further experiments are required for the exact closed mathematical description of the phenomenon.

The electrostatic module can be comprised of individual electrodes. For contacting the individual electrodes, at least one rolling element can be used in particular for the Johnsen-Rahbek effect, wherein per electrode, exactly one rolling element, preferably more than 1, preferably more than 2, particularly preferably more than 3, very particularly preferably more than 4 rolling elements are used.

Furthermore, either unipolar electrodes or bipolar electrodes can be used.

Preferably, an electrostatic module with electrodes connected in a bipolar manner is used, wherein the number of electrodes is more than 1, preferably more than 3, particularly preferably more than 7, very particularly preferably more than 14.

The electrodes can preferably be regulated and/or controlled individually, and/or particularly preferably in pairs, and/or very particularly preferably combined in groups.

Coupling the electrostatic and the mechanical module of the substrate holder, particularly by means of the Johnsen-Rahbek effect For generating the electrostatic holding force, particularly by means of the Johnsen-Rahbek effect, a galvanic contacting of the electrodes with the weakly conductively designed dielectric holder is required.

In order to remedy the disadvantages of the prior art, sliding contacting is dispensed with.

Electrically conductive and rolling coupling elements, also termed rolling elements are used. The different embodiments of the rolling elements can include balls, spherical rollers, rollers and/or needles.

Less abrasion is created by means of a rolling movement than with rolling boring or pure sliding. If a rolling element has different angular speeds (tangential speeds) as a rigid solid body, only one point can carry out a pure rolling movement. Other parts of a rigid solid body rotate with a mixed form between rolling and slipping, which movement can also be interpreted as sliding. Rolling creates the least abrasion, sliding the most.

During the rolling of spherical rollers or rollers or needles, however, pure rolling is not achieved owing to different radial speeds, which results in the emission of particles due to friction, which particles are disadvantageous.

In order to ensure a permanent galvanic contact between the non-rotated electrodes of the electrostatic module and the rotatable holder, the electrostatic module can in particular support the rolling elements and the holder in a spring-loaded prestressed manner, without, however, deforming the holder substantially, i.e. particularly microscopically or macroscopically.

It is therefore provided in design terms that in the mechanical chain of effects, holder, rolling element, electrode (not specified in more detail), substrate, at least one spring is accommodated as elastic and electrically conductive element. The substrate may represent the framework and the further parts of the mechanical module with the movement devices for the other degrees of freedom.

If the insertion of the spring occurs between holder and rolling element, this creates undesired abrasion.

In a further embodiment, the rolling element can have the spring characteristic, particularly functionally integrated as a conductive elastomer block, similarly to a ball. It is possible to configure the rolling element as an elastic, resilient, spherical cage.

In a further embodiment, the electrode can be guided and the spring can exert the prestress force between electrode and substrate.

In another preferred embodiment, the stationary, non-rotatable electrostatic module can produce the contact for prestressing the rolling elements, particularly in a position-regulated manner (with distance encoder, actuator, evaluation unit).

For an embodiment without rolling elements, the position regulation of the electrostatic module in relation to the holder is advantageous for the optimization of the distance, and as a result, the holding force.

Further Properties

The thermal properties of the holder are to be taken into account during design. These include the thermal heat capacity, the thermal expansion and the temperature stability.

The heat capacity of the substrate holder according to the invention, particularly of the holder, is as small as possible, in order to prevent storage of heat.

For most solid bodies, at moderate temperatures and pressures, the heat capacitance at constant volume only differs marginally from the heat capacitance at constant pressure. Therefore, in the remainder of the specification, no distinction is made between the two heat capacities.

Furthermore, specific heat capacitances are specified. The specific heat capacity is lower than 20 kJ/(kg*K), preferably lower than 10 kJ/(kg*K), more preferably lower than 1 kJ/(kg*K), most preferably lower than 0.5 kJ/(kg*K), most preferably of all lower than 0.1 kJ/(kg*K).

The coefficient of thermal expansion of the substrate holder and in particular of the holder should be a as small as possible, in order to prevent distortion of the holder by means of the temperature differences. The linear coefficient of thermal expansion is in lower than $10^{-4}K^{-1}$, preferably lower than $5*10^{-5}K^{-1}$, more preferably lower than $10^{-5}K^{-1}$, most preferably lower than $5*10^{-6}K^{-1}$, most preferably lower than $10^{-6}K^{-1}$, most preferably of all lower than $10^{-7}K^{-1}$.

The dielectric properties of the holder can be described sufficiently precisely using the relative permittivity (data measured between 0 Hz and 100 Hz). Thus, for the material of the holder, a permittivity of greater than 1, preferably greater than 1.5, particularly preferably greater than 2, is provided.

The specific electrical resistance of the holder, at least of the holding surface, should preferably lie between $5\times10^{\wedge}9$ $\Omega$cm and $8\times10^{\wedge}10$ $\Omega$cm.

The resistance of the holder should be so low in a preferred embodiment that during plasma processing, the impinging electrical and/or electrostatic charges are dissipated in less than 5 seconds, preferably less than 2 seconds, particularly preferably less than 1 second, in the optimum case less than 0.5 second.

In a preferred embodiment of the holder, a targeted electrical conductivity is achieved by means of buried electrical conductors and/or conductor tracks.

In a further preferred embodiment, a certain electrical conductivity is achieved by means of doping. In particular, to produce conductor tracks, highly doped regions and paths are created.

The material of the dielectric and/or the coating can contain the following materials, inter alia:
  aluminium and the oxides and/or nitrides and/or carbides thereof,
  silicon and the oxides and/or nitrides and/or carbides thereof and crystallization forms thereof, such as alpha-Si,
  titanium and the oxides and/or nitrides and/or carbides thereof,
  zirconium and the oxides and/or nitrides and/or carbides thereof,
  yttrium and the oxides and/or nitrides and/or carbides thereof,
  carbon, also deposited pyrolytically in particular as graphite or carbon in a diamond-like form (diamond-like carbon, DLC).

Further advantages, features and details of the invention result from the following description of preferred exemplary embodiments, as well as on the basis of the drawings.

BRIEF DESCRIPTION OF THE DRAWINGS

FIG. 3a shows a schematic sectional illustration of part of a different embodiment, FIG. 3b shows a schematic sectional illustration of part of a different embodiment, FIG. 4a shows a schematic sketch of a different embodiment, FIG. 4b shows a schematic sketch of a different embodiment, FIG. 5 shows a schematic illustration of a holder of a different embodiment.

In the figures, the same components or components with the same function are labelled with the same reference numbers.

DETAILED DESCRIPTION OF THE INVENTION

Figure 1:
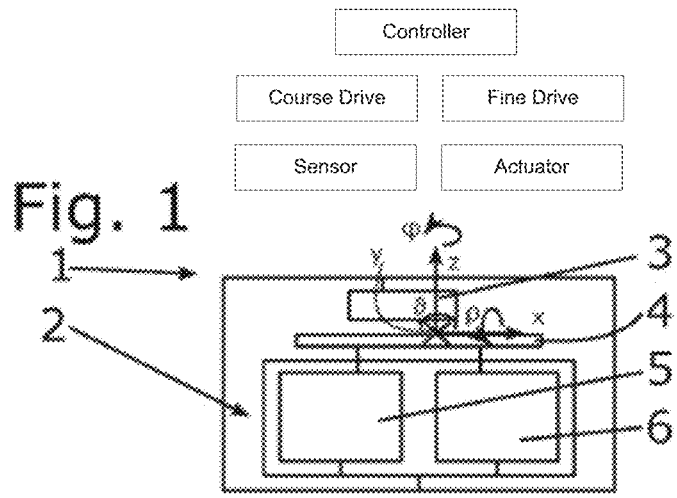
FIG. 1 shows a schematic functional and structural plan of a processing plant with a substrate holder according to the invention.

FIG. 1 shows a schematic functional and structural plan of a processing plant 1 with a substrate holder 2 according to the invention and exemplary subfunctions. The Z direction or Z axis runs perpendicularly or as a surface normal to the holding surface. The X, Y directions or axes run perpendicularly to one another and parallel to or in the holding surface of the holder.

A rotation about the x axis is labelled with $\rho$, a rotation about the y axis is labelled with $\vartheta$ and a rotation about the z axis is labelled with $\varphi$.

The processing plant 1, particularly a vacuum and/or high-vacuum and/or ultra-high-vacuum plant, designed in particular as a coating and/or joining (bonding) and/or vaporization and/or plasma plant for surface change, such as oxide removal, functionalization of a surface, such as amorphization, is illustrated with the main function in the structural plan.

The processing plant 1 fulfils the main function by means of a processing apparatus 3. The processing plant 1 contains the substrate holder 2 according to the invention, which is connected to a substrate 4, that is to say fastens and/or moves the substrate 4.

The functionality of the substrate holder 2 is divided into an electrostatic module 5 (stator 5) and into a mechanical module 6 (rotor 6), which together act on the substrate 4. Thus, the substrate holder 2 can carry out the movement procedures according to the invention during the processing of the substrate 4.

The connecting lines indicate a logical and/or material coupling of the individual listed parts, but measurement and/or regulation and/or supply systems or the processing of the substrate 4 are not listed graphically.

In particular, measurement sensors, data memories, logic circuits, energy, pneumatic, hydraulic and material flows and relationships are not illustrated.

Figure 2A:
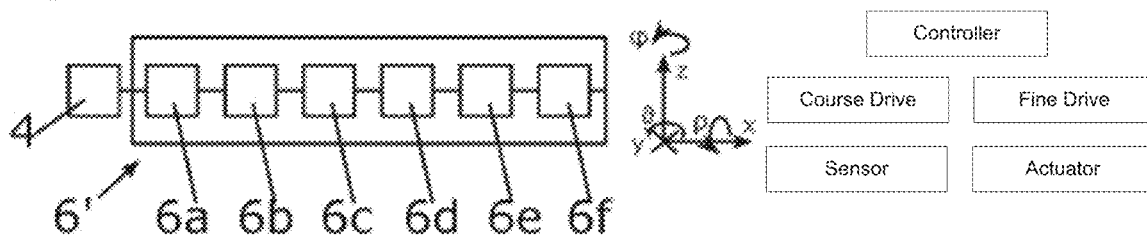
FIG. 2a shows a schematic functional plan of an exemplary embodiment.

FIG. 2a shows a schematic functional plan of a first exemplary embodiment of a mechanical module 6' of the substrate holder 2 according to the invention.

The logical sequence of the distribution of six degrees of freedom of movement for the mechanical module 6' is built up serially in the embodiment. Thus, as viewed from the substrate 4, a translation in the z-direction 6a is executed, which executes a lifting and lowering of the substrate 4, particularly for setting a distance between the processing apparatus 3 and the substrate 4.

In relation to the next degree of freedom, the substrate 4 is rotated about the axis z in $\varphi$ using an appropriate device 6b. Corresponding devices are used for the movement of a rotation about the y-axis 6c and a rotation about the x-axis 6d.

In an alternative embodiment, 6c and 6d are interchangeable with one another, so that in particular, a cardanic arrangement, which is not illustrated, and/or a spherical calotte design are to be considered to be equivalent to one another for the rotations. Thus, an innocent, low-error form of the substrate holder can be achieved.

For the naming convention of the remaining translations, it is true that they may also be interchangeable with one another, wherein a translation in the y-direction 6e is executed here by the substrate 4 in relation to the fifth degree of freedom and a translation in x-direction 6f takes place in relation to the last or sixth degree of freedom.

Thus, all degrees of freedom of movement are covered by the substrate holder according to the invention, but redundancies and/or composite drives of the processing plant 1, such as a division of a movement into coarse positioning and fine positioning in particular.

Figure 2B:
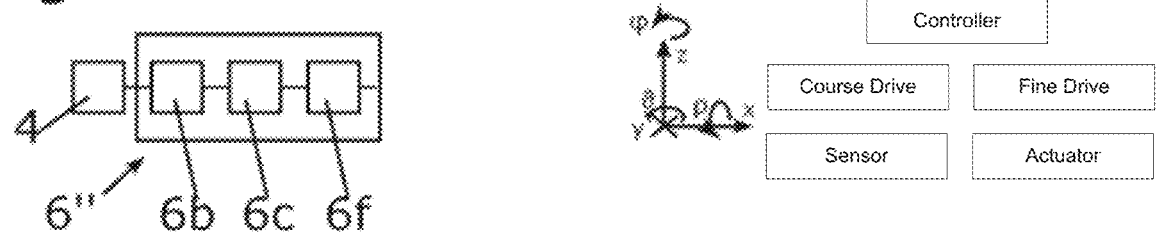
FIG. 2b shows a schematic functional plan of a different exemplary embodiment.

FIG. 2b is a schematic functional plan of a second exemplary embodiment of a mechanical module 6" of the substrate holder 2 according to the invention.

In this case, the mechanical module 6", as viewed from the substrate 4, can execute the degrees of freedom of rotation about the z-axis 6b, the rotation about the y-axis 6c and the translation in the x-direction 6f. In a further embodiment, which is not illustrated, a different sequence of the coordinate axes and corresponding drives is possible, so that instead of the translation in the x-direction 6f, the translation in the y-direction 6e takes place. Then, the rotation about the x-axis 6d is carried out. The rotation about the x-axis 6b is retained as a function according to the invention.

Figure 2C:
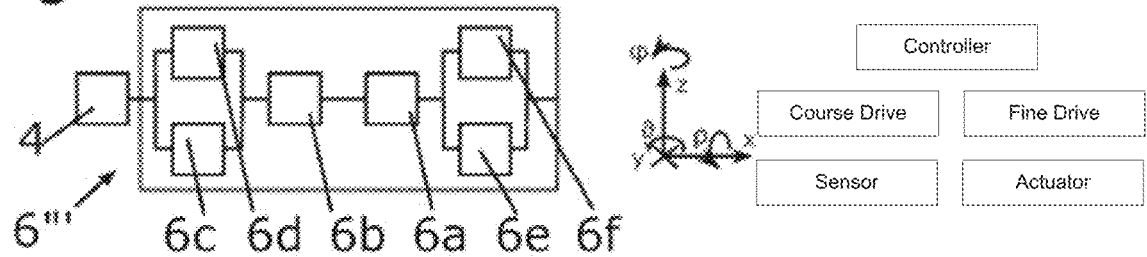
FIG. 2c shows a schematic functional plan of a different exemplary embodiment.

FIG. 2c is a schematic functional plan of a third exemplary embodiment of a mechanical module 6'" of the substrate holder 2 according to the invention. It represents a possible combination of the degrees of freedom of movement, wherein due to the parallelization, in particular the use of direct drives and integrated functionalities, particularly measurement and regulation systems for position detection and stabilization and/or active vibration damping and/or active cooling, and/or active temperature stabilization and/or self-containment behaviour is preferred according to the invention.

Thus, as viewed from the substrate 4, an innocent, low-error arrangement of the two rotations about the y-axis 6c and about the x-axis (6d) is also achieved with the downstream-connected rotation about the z-axis 6b. This is advantageous for minimizing, in certain embodiments for eliminating, tilting errors of the first order of the substrate holder.

The translation in the x-direction 6a and in a parallel arrangement, the translation in the y-direction 6e and the translation in the x-direction 6f are executed according to the degrees of freedom of rotation 6c, 6c. 6b. The advantages for this particularly preferred embodiment furthermore lie in the reduced number of individual moving components, if combined drives, particularly direct drives are used.

FIG. 3a is a schematic sectional illustration, which is not to scale, in a side view of a part of a first embodiment of the electrostatic substrate holder 2 according to the invention.

The substrate 4 is placed with a substrate outer surface 4a on a holding surface 7h of a holder 7 and fastened by means of electrostatic means, which are illustrated by means of an electrostatic module 5'.

The holder 7 is coupled to a further movement apparatus 9 by means of rolling elements 8. This embodiment according to the invention shows the substrate holder 2, which develops an electrostatic force by means of the Coulomb effect.

The rolling elements 8 can be configured as bearings, particularly axial bearings and/or axial radial bearings. Thus, the points of greatest friction and particle generation can be designed to be configured remotely from the substrate.

A decoupling of the purely mechanical parts 7, 8 and 9 from the electrostatic module 5' is symbolized by the distances or empty spaces.

The coordinate directions x, y, z of a Cartesian coordinate system are drawn in schematically. As this is an abstract functional sketch, the drives and/or supply units and/or measurement and/or regulation devices are not illustrated pictorially. Energy and material flows and movement procedures are not illustrated.

FIG. 3b is a schematic sectional illustration, which is not to scale, in a side view of a part of a second embodiment of the electrostatic substrate holder 2 according to the invention.

The substrate 4 is placed with the substrate outer surface 4a on a holding surface 7h of a holder 7 and fastened by means of electrostatic means, which are illustrated by means of an electrostatic module 5'. The holder 7' is coupled to the further movement apparatus 9 by means of rolling elements 8.

This embodiment according to the invention shows the substrate holder 2, which develops an electrostatic force by means of the Johnsen-Rahbek effect.

The rolling elements 8 can be configured as bearings, particularly axial bearings and/or axial radial bearings. Thus, the points of greatest friction and particle generation can be designed to be configured remotely from the substrate 4.

Electrostatic rolling elements 10 connect the holder 7' to the electrostatic module 5". An electrostatic coupling of the substrate 4 to the holder 7' and to the electrostatic rolling elements 10 takes place using the electrostatic module 5".

A mechanical coupling of the parts 7'. 8 to 9 takes place separately from the electrostatic coupling.

As this is an abstract functional sketch, the drives and/or supply units and/or measurement and regulation devices are not illustrated pictorially. Energy and material flows and movement procedures are not illustrated.

FIG. 4a constitutes a schematic sketch as a plan view of a third embodiment of an electrostatic module 5*iii* according to the invention. In this case, electrodes 11 run as concentric rings.

The electrodes 11 can in particular generate the electrostatic holding force with the connection of at least one source and at least one drain. If more than one pair of electrodes 11 are used, the substrate 4 can be pulled flat and then held using electrodes 11 connected in an expedient sequence. According to the invention, it is important to hold the substrates with as little distortion as possible. For pulling flat, in particular, first an electrode pair with small diameter can fasten the centre of the substrate and gradually the electrodes with larger diameters are connected. This leads to pulling flat continuously, so that the back-thinned substrate is not exposed to additional rippling or force.

FIG. 4b constitutes a schematic sketch of a plan view of a fourth embodiment of an electrostatic module 5*iv* according to the invention. In this case, electrodes 11' run as circular ring sectors.

The electrodes 11' can in particular generate the electrostatic holding force with connection of at least one source and at least one drain. If more than one pair of electrodes 11' are used, the substrate 4 can be pulled flat and then held using electrodes 11' connected in an expedient sequence. In particular, mutually opposite electrodes can be connected, so that a successive rolling out and holding can occur.

Further forms of the electrodes 11, 11' and electrode pairs are not illustrated; it is however possible according to the invention to use surface-optimized, particularly circular or hexagonal or rectangular electrodes.

FIG. 5 illustrates a schematic illustration in a side view of a holder 7" of a further embodiment of the electrostatic substrate holder 2 according to the invention.

A holding surface 7h" is designed in a planar manner in particular. A distance T represents a distance of the holding surface 7h" from electrodes 11".

The distance T can be used for designing the electrostatic force for simulation purposes and is preferably minimal.

In this embodiment according to the invention, the electrodes 11" are attached in radial depressions of the holder 7".

The holder 7" is designed to be rotatable and the electrodes 11" are designed to be stationary (in relation to the holder 7").

A distance H shows the, in particular, optimized functional height, particularly the thickness of the holder 7".

REFERENCE LIST

1 Processing plant
2 Substrate holder
3 Processing apparatus
4 Substrate
4a Substrate outer side
5, 5', 5", 5iii, 5iv Stator/electrostatic module
6, 6', 6", 6''' Rotor/mechanical module
6a Translation in z-direction
6b Rotation about the z-axis, in φ
6c Rotation about the y-axis, in ϑ
6d Rotation about the x-axis, in ρ
6e Translation in y-direction
6f Translation in x-direction
7, 7', 7" Holder
7h, 7h', 7h" Holding surface
8 Rolling element
9 Movement device
10 Electrostatic rolling element
11, 11', 11", Electrode
x, y, z Axes of the Cartesian coordinate system Having described the invention, the following is claimed:

1. An electrostatic substrate holder for accommodating and holding a substrate, said electrostatic substrate holder comprising:
 a rotor having a holder for fixing the substrate on a planar holding surface of the holder,
 a stator for accommodating and bearing the rotor, the stator including a planar stator surface parallel to the planar holding surface,
 electrodes for generating an electrostatic holding force for fixing the substrate,
 wherein the electrodes are disposed on the planar stator surface of the stator, whereby the electrodes are separated from the holding surface, and
 wherein the rotor is mounted by means of electrically conductive bearing elements, the electrically conductive bearing elements contacting the electrodes of the stator.

2. The electrostatic substrate holder according to claim 1, wherein the electrically conductive bearing elements comprise ball bearings and/or deep groove ball bearings and/or angular contact ball bearings and/or spherical roller bearings and/or axial bearings and/or radiax bearings.

3. The electrostatic substrate holder according to claim 1, wherein a thickness of the holder in a Z direction is less than 100 mm.

4. The electrostatic substrate holder according to claim 1, wherein a distance between the electrodes and the holding surface is less than 100 millimetres.

5. The electrostatic substrate holder according to claim 1, wherein the electrostatic substrate holder includes depressions arranged on a side of the holder facing away from the substrate, additional electrodes arranged in the depressions, wherein the depressions are constructed concentrically and/or as channels.

6. The electrostatic substrate holder according to claim 1, wherein the electrodes are constructed as rings.

7. The electrostatic substrate holder according to claim 6, wherein the rings are arranged in an equidistant and/or concentric manner.

8. The electrostatic substrate holder according to claim 1, wherein the electrodes are constructed as circle segments, and/or circular ring sectors.

9. The electrostatic substrate holder according to claim 1, wherein the holder is formed as a honeycomb structure.

10. The electrostatic substrate holder according to claim 1, wherein the electrostatic substrate holder includes a positioning, holding and moving system for moving the substrate and/or the holder.

11. The electrostatic substrate holder according to claim 10, wherein the positioning, holding and movement system is constructed for at least one degree of freedom using a coarse drive and a fine drive.

12. The electrostatic substrate holder according to claim 11, wherein the coarse and fine drives of the positioning, holding and movement system are configured such that in a non-moved state without operating voltage and/or current and/or other power supply, the coarse and fine drives maintain the respective position and/or stop.

13. The electrostatic substrate holder according to claim 1, wherein the substrate and/or the holder are movable in at least three degrees of freedom.

14. The electrostatic substrate holder according to claim 13, wherein the substrate and/or the holder are movable in all six degrees of freedom.

15. The electrostatic substrate holder according to claim 1 wherein the electrostatic substrate holder includes:
 a central control unit and/or a regulating unit for controlling and/or regulating movements and/or procedures.

16. The electrostatic substrate holder according to claim 15, wherein the central control unit and/or the regulating unit is for a fixing of the substrate, a position of the holder, speeds, and/or accelerations of the holder.

17. The electrostatic substrate holder according to claim 1, wherein the electrostatic substrate holder includes:
 at least one sensor for measuring influencing factors, and at least one actuator for controlling and/or regulating as a function of the measured influencing factors.

18. The electrostatic substrate holder according to claim 17, wherein the at least one sensor includes a distance and/or a position sensor.

19. The electrostatic substrate holder according to claim 17, wherein the at least one actuator includes a position encoder and/or an angle encoder.

20. A processing plant, having a processing apparatus for processing a substrate and an electrostatic substrate holder for holding the substrate, said electrostatic substrate holder comprising:

a rotor having a holder for fixing the substrate on a planar holding surface of the holder, a stator for accommodating and bearing the rotor, the stator including a planar stator surface parallel to the planar holding surface, electrodes for generating an electrostatic holding force for fixing the substrate, wherein the electrodes are disposed on the planar stator surface of the stator, whereby the electrodes are separated from the holding surface, and wherein the rotor is mounted by means of electrically conductive bearing elements, the electrically conductive bearing elements contacting the electrodes of the stator.

21. A method for processing a substrate, wherein the method includes:

providing an electrostatic substrate holder having:

a rotor having a holder for fixing the substrate on a planar holding surface of the holder, a stator for accommodating and bearing the rotor, the stator including a planar stator surface parallel to the planar holding surface, electrodes for generating an electrostatic holding force for fixing the substrate, wherein the electrodes are disposed on the planar stator surface of the stator, whereby the electrodes are separated from the holding surface, and wherein the rotor s mounted by means of electrically conductive bearing elements, the electrically conductive bearing elements contacting the electrodes of the stator holding and rotating the substrate by means of the electrostatic substrate holder.

* * * * *